US012635513B2

(12) United States Patent
Lanzillo et al.

(10) Patent No.: US 12,635,513 B2
(45) Date of Patent: May 19, 2026

(54) INTERCONNECT STRUCTURE WITH INCREASED DECOUPLING CAPACITANCE

(71) Applicant: INTERNATIONAL BUSINESS MACHINES CORPORATION, Armonk, NY (US)

(72) Inventors: Nicholas Anthony Lanzillo, Wynantskill, NY (US); Albert M. Chu, Nashua, NH (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 680 days.

(21) Appl. No.: 17/935,931

(22) Filed: Sep. 27, 2022

(65) Prior Publication Data

US 2024/0105583 A1     Mar. 28, 2024

(51) Int. Cl.
H01L 23/522     (2006.01)
G06F 30/392     (2020.01)
H01L 21/768     (2006.01)
H01L 23/528     (2006.01)
H01L 23/532     (2006.01)

(52) U.S. Cl.
CPC ........ H01L 23/5223 (2013.01); G06F 30/392 (2020.01); H01L 21/76816 (2013.01); H01L 23/5286 (2013.01)

(58) Field of Classification Search
CPC ............. H01L 23/5223; H01L 23/5286; H01L 23/522; H01L 23/5222; H01L 23/5329; G06F 30/392
See application file for complete search history.

(56) References Cited

U.S. PATENT DOCUMENTS 5,148,263 A     9/1992  Hamai
5,371,403 A     12/1994  Huang et al.
        (Continued)

FOREIGN PATENT DOCUMENTS

TW          202114234 A     4/2021
WO       2020210932 A1     10/2020

OTHER PUBLICATIONS

Taiwan Patent Office, "Notice of Allowance," Oct. 30, 2024, 6 Pages, TW Application No. 112117855.
        (Continued)

*Primary Examiner* — Omar F Mojaddedi
(74) *Attorney, Agent, or Firm* — Scully, Scott, Murphy & Presser, P.C.; L. Jeffrey Kelly, Esq.

(57)     ABSTRACT

A semiconductor chip device includes a substrate with a first dielectric material of a first permittivity value. A power input line and ground line are positioned in the substrate and arranged to form a decoupling capacitor. A region of the substrate in between the power input line and the ground line is doped with a second dielectric material of a second permittivity value that is higher than the first permittivity value. The region doped with the second dielectric material lacks a signal body. By incorporating a region with higher permittivity, in what is generally unused space for power delivery, the region becomes a decoupling capacitor for nearby power delivery elements. By adding decoupling capacitance to the previously unused space, noise in a circuit is more easily controlled and the chip device becomes more reliable.

8 Claims, 5 Drawing Sheets

(56)     References Cited

U.S. PATENT DOCUMENTS

| | | | |
|---|---|---|---|
| 5,949,098 A | 9/1999 | Mori | |
| 6,205,013 B1 | 3/2001 | Gong et al. | |
| 8,421,205 B2 | 4/2013 | Yang | |
| 8,881,087 B2 | 11/2014 | Herder et al. | |
| 10,062,640 B2 | 8/2018 | Park et al. | |
| 2003/0161128 A1 | 8/2003 | Masuda | |
| 2013/0270675 A1* | 10/2013 | Childs | H10D 1/692 |
| | | | 257/532 |
| 2020/0020644 A1* | 1/2020 | Lee | H01L 23/49822 |
| 2021/0057517 A1* | 2/2021 | Chen | H01L 21/0217 |
| 2025/0266415 A1* | 8/2025 | Lee | H01L 23/5226 |

OTHER PUBLICATIONS

Tork, A. et al., "Power Grid Automatic Metal Filling Algorithm Forming Maximum on-chip Decoupling Capacitance"; IEEE (2007); pp. 157-159.

* cited by examiner

High-k

Traditional ULK

INTERCONNECT STRUCTURE WITH INCREASED DECOUPLING CAPACITANCE

BACKGROUND

Technical Field

The present disclosure generally relates to electrical devices, and more particularly, to an interconnect structure with increased decoupling capacitance.

Description of the Related Art

Current applications using computing chips can vary widely in their needs for operational reliability. Some consumer products, for example, mobile phones, can operate satisfactorily using chips whose reliability requirements are not so stringent. However, there are many applications that involve high performance computing that seek to avoid chip failures. For example, banking networks, airport control systems, and government agency servers need to be up and running without interrupt as much as possible. For applications where 99.9% reliability is desired, spikes from a power supply cannot be tolerated because noise from spikes can corrupt processing output. A power surge may cause a spike in current which sometimes damages the device so that a localized failure occurs, if not a total device failure.

SUMMARY

According to an embodiment of the present disclosure, a semiconductor chip device is provided. The semiconductor device includes a substrate. The substrate includes a first dielectric material of a first permittivity value. A first power input line is positioned in the substrate. A first ground line is positioned adjacent the first power line and is arranged to form a first decoupling capacitor in cooperation with the first power input line. A region of the substrate in between the first power input line and the first ground line is doped with a second dielectric material of a second permittivity value. The second permittivity material value is higher than the first permittivity value. The region lacks a signal body. By incorporating a region with higher permittivity, in what is generally for example, unused space for power delivery (because of the lack of a signal body), the region becomes a decoupling capacitor for nearby power delivery elements. By adding decoupling capacitance to the previously unused space, noise in a circuit is more easily controlled and the chip device becomes more reliable.

In an embodiment, which may be combined with the preceding embodiments, the region of the substrate doped with the second dielectric material includes a disconnected metallic fill body. The metallic fill body is typically a passive element used to control the metallic density in the chip device and usually does not play a part in power delivery. However, some embodiments may connect the metallic fill body to the power input line (or the ground line). By connecting the metallic fill body to one of the adjacent power delivery elements, the amount of decoupling capacitance can be controlled for an application, thus making the previously dormant region of the device more useful for power delivery designs.

According to an embodiment of the present disclosure, a computer processor implemented method of designing a power delivery network in a semiconductor substrate is provided. The method includes identifying positions for power input lines, ground lines, signaling lines, and metallic fill bodies in the semiconductor substrate. The semiconductor substrate includes a first dielectric material of a first permittivity value. Areas of the substrate positioned between power input lines and ground lines that include one or more metallic fill bodies are identified. A desired decoupling capacitance is determined for selected regions between the identified areas. An amount of a second dielectric material of a second permittivity value is determined to provide the desired decoupling capacitance in the selected regions. The second permittivity value is greater than the first permittivity value and the amount of the second dielectric material needed is based partly on an amount of metal material present in the one or more metallic fill bodies present in the selected regions. A volume for the selected regions for deposition of the determined amount of the second dielectric material is determined. Lithography and/or etching pattern masks are generated for the power delivery network. The masks include the positions for the power input lines, the ground lines, the signaling lines, the metallic fill bodies, and the selected regions including the second dielectric material.

In an embodiment, which may be combined with the preceding embodiments, the method includes identifying a selected pair of a power input line and a ground line that have a selected region in between the selected pair. The method further positions a second power input line in a layer above or below the selected region. The second power input line spans across the selected region and is orthogonal to the selected pair. The method further includes patterning a first via in the second power input line connecting the second power input line to the power input line of the selected pair. The embodiment adds further flexibility to creating decoupling capacitance in the previously unused region. By connecting the original power input line to another power input line, additional connections in the power delivery network can be made, including for example, connecting to a metallic fill body in the high dielectric region. The second power input line allows power delivery designs increased options in designing the decoupling capacitance because the spacing between the elements defining a capacitor can be decreased by jumping the power input to a metallic fill body closer to the ground line (or vice versa). A jump may be necessary when other metallic fill bodies are present in the high-k dielectric region.

According to an embodiment of the present disclosure, method of manufacturing for forming interconnections in a semiconductor substrate is provided. The method includes depositing a first layer of a first dielectric material. An area of the first layer of the first dielectric material is selectively removed for placement of a first metallic fill body. A second dielectric material is deposited in the area of selectively removed first dielectric material. The second dielectric material has a higher permittivity value than the first dielectric material. The first metallic fill body is placed in the second dielectric material. A first power input line is placed in the first layer of first dielectric material, adjacent to the second dielectric material on a first side of the second dielectric material. A first ground line is placed in the layer of first dielectric material, adjacent to the second dielectric material, and on a second side of the second dielectric material. The first power input line, the second dielectric material, and the first ground line are disposed to form a decoupling capacitor.

In an embodiment, which may be combined with the preceding embodiments, the method includes determining a desired decoupling capacitance for the decoupling capacitor. A position of the metallic fill body in the area of selectively removed first dielectric material is determined relative to either the first power input line or the first ground line, to provide the determined desired decoupling capacitance. As will be appreciated, the metallic fill in semiconductor devices can be used as an active element whose position in the device serves a dual role of providing material density and actively providing a capacitive relationship with one of the power delivery lines. The position of the metallic fill body becomes adjustable so that decoupling capacitance in an area of the device can be controlled.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments.

Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

Figures 1, 2:
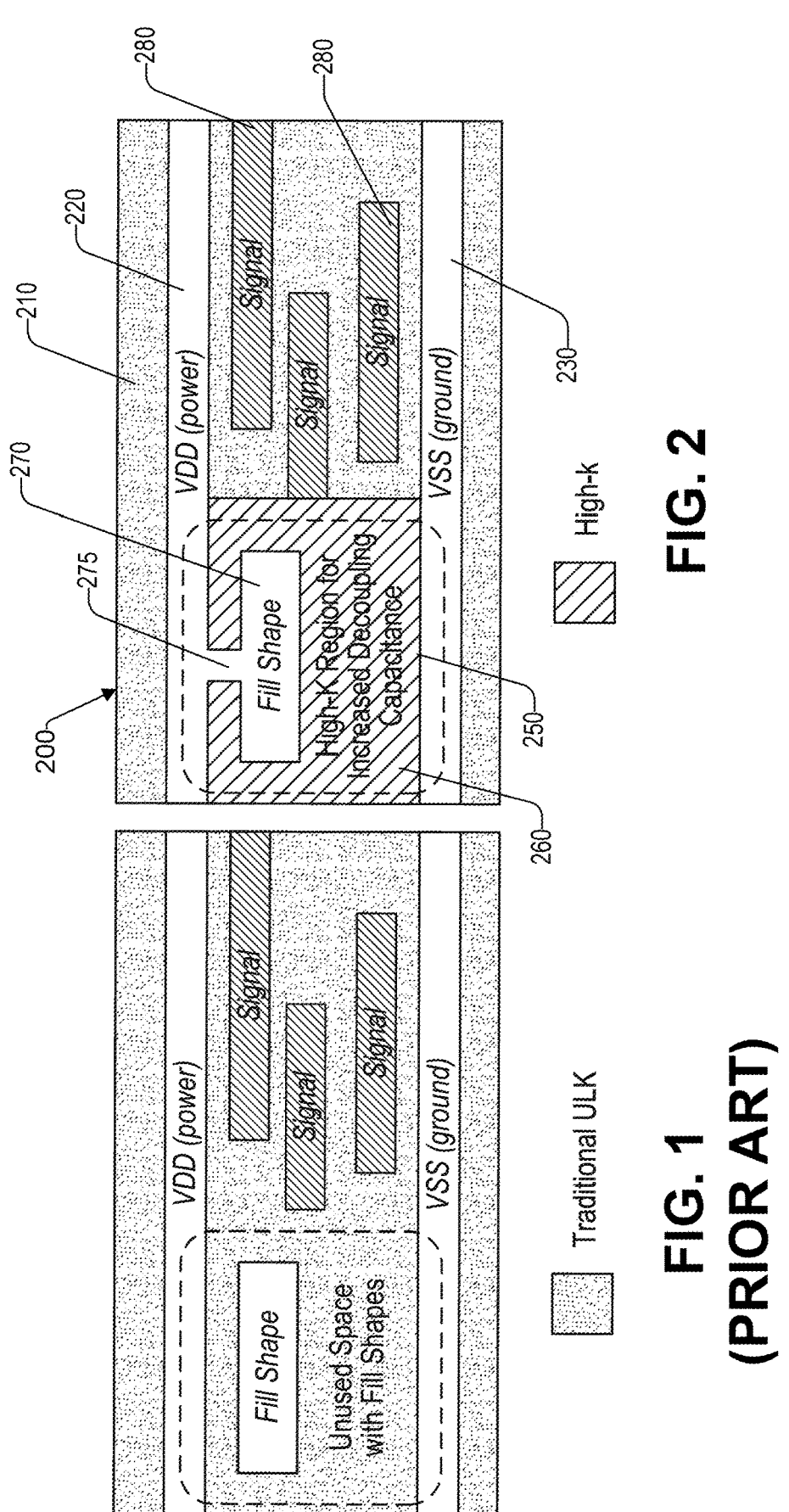
FIG. 1 is a diagrammatic view of a section of a conventional semiconductor device signal routing scheme with an unused region of the substrate.
FIG. 2 is a diagrammatic view of a section of a semiconductor device signal routing scheme incorporating a high permittivity value dielectric material to an unused space of the device substrate, according to an embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Power delivery structures in computing chips generally suffer from noise in the circuits and reliability in power delivery. The power supply bus is a common source of noise since the input voltage can fluctuate. If a system detects that a logic block is not producing a proper output, the system may invoke a failsafe mechanism to avoid using the damaged device. However, the device remains unusable and must be replaced. One common approach to reducing noise includes using decoupling capacitors to stabilize voltage signals provided into the circuit elements.

Traditional decoupling capacitors may be too large to use in newer semiconductor chip devices. While some arrangements place a ground signal line in close proximity to a power signal line in the die substrate to form a decoupling capacitor, the useable area for routing signals in a device is at a premium. There are constraints involved in positioning certain circuits elements in proximity to other elements on a chip die that limit the use of the chip substrate. The placement of decoupling capacitors within the normally used areas of power delivery limits the area useable for signaling.

FIG. 1 shows a diagram of a section of a conventional signal routing system in a semiconductor device. The power input line VDD is separated from the ground line Vss by a region of dormant substrate space. Signal lines may be positioned adjacent to the dormant space but are disconnected from any material or features in the dormant space. For example, in some devices, the dormant space may include a metallic fill body that is present to increase the metal density in the device but is otherwise not used to carry a signal. There may be several unused dormant spaces in a semiconductor device. As can be seen, while used for occupying fill bodies, the dormant spaces do not contribute to actual power delivery and represent inefficient real estate in the device.

Reference is now made to FIG. 2, which shows a section of a semiconductor device 200 (sometimes referred to generally as the "device 200") according to an embodiment. It will be understood that the semiconductor device 200 may include several more elements in other parts of the device 200 than is shown but for sake of illustration, the focus described is on the arrangement of the features shown in the figure. In addition, while elements in the figure are shown arranged in parallel, some of the features (for example, power, signal, and ground lines) may change direction in other parts of the device 200.

Referring back to FIG. 2, the semiconductor device 200 includes features that decrease noise in the device and improves reliability of the device. The device 200 includes a substrate 210 of low permittivity dielectric material (an ultra-low k dielectric), that maybe for example porous silicon dioxide. The k value of the dielectric material for the substrate 210 is generally less than 4.2 (and generally does not approach 4.2 as a k value) and behaves as an insulator. A power input line 220 and a ground line 230 may be positioned on a first layer of the substrate 210. Sections of the power input line 220 and the ground line 230 may be in parallel and separated by the low-k dielectric material and in some sections, by signal line bodies 280. The default capacitance between the power input line 220 and the ground line 230 may be considered weak (to reiterate, acting as an insulator) since the dielectric material of the substrate 210 is of the ultra-low k variety. Embodiments of the device 200 include a region 250 (that is normally unused, dormant space) doped with a dielectric material 260 that has higher permittivity (a high-k value) than the dielectric material of the substrate 210. A high-k value in the disclosure means that the dielectric material 260 has a k value of 4.2 or higher and generally in the range of 6-7 as a k value.

As may be appreciated, by incorporating a high-k value dielectric into the region 250, the device 200 is provided a decoupling capacitor 205 structure (when operating in cooperation with the power input line 220 and the ground line 230) effective to provide decoupling capacitance to nearby signal line bodies 280. In some embodiments, the volume of dielectric material 260 in the region 250 may be selectively controlled to provide a desired magnitude of capacitance. While the region 260 is shown as extending from the power input line 220 to the ground line 230, in some embodiments, the volume of dielectric material 260 may occupy less than the entire region 250. In addition, while FIG. 2 shows one of the signal line bodies in contact with the dielectric material 260, as depicted by the other signal line bodies 280, contact with the dielectric material 260 is not necessarily required in some embodiments.

In some embodiments, the region 250 with high-k value dielectric material may include one or more floating metallic fill bodies 270. When "floating", the metallic fill bodies 270 may generally be disconnected from any other signal line 280 or power feature and generally do not include vias or any other interconnect element. As a passive element in the region 250, the metallic fill bodies 270 may not affect the decoupling capacitance to any notable degree. However, some embodiments may include a conductive line 275 that connects a metallic fill body 270 to either the power input line 220 or to the ground line 230. FIG. 2 shows the conductive line 275 connecting a metallic fill body in the region 250 adjacent the power input line 220 to the power input line 220. As may be appreciated, the metallic fill body 270 connected to the power input line 220 becomes a conductor when power is provided to the power input line 220. The effective decoupling capacitor 205 in the embodiment discussed includes the metallic fill body 270 as one conductor, the dielectric material 260. and the ground line 230 as the apposing conductor. As can be seen, by connecting a metallic fill body 270 to one of the conductor lines (220 or 230), the decoupling capacitance in the subject area can be manipulated for a desired output. While only a single metallic fill body 270 is shown in the figure, it will be understood that multiple fill bodies 270 may be present. Accordingly, there may be a conductive connection 275 connecting each of the power input line 220 and ground line 230 to a respective metallic fill body 270.

Figure 3:
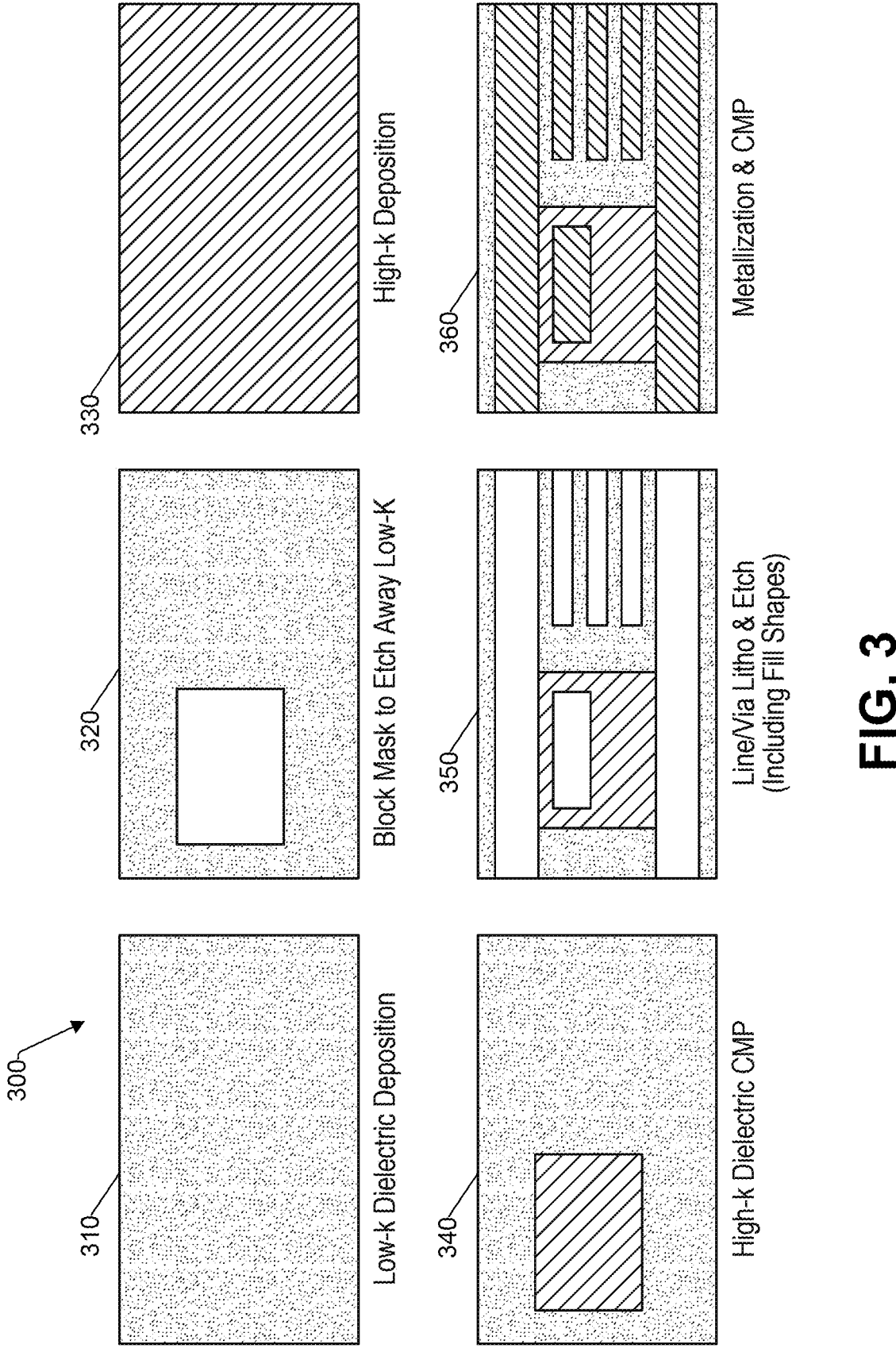
FIG. 3 is a series of process flow steps depicting a method of manufacturing a semiconductor device, according to another embodiment.

FIG. 3 illustrates a process 300 for manufacturing a semiconductor device incorporating the design of a power delivery network according to embodiments of the subject disclosure. As a general starting point, in block 310, a low-k value material is selected for deposition as a substrate. In block 320, mask patterns for blocking areas designated for integration of a high-k value dielectric material may be positioned on the substrate. Substrate material may be removed (for example, etched away) from the areas designated for high-k value dielectric material. In block 330, a high-k value dielectric material may be deposited on to the substrate into the areas designated for providing a decoupling capacitance. In block 340, a chemical mechanical polishing (or planarization) (CMP) process may be used to polish the region with high-k value dielectric material. In block 350, conductive lines, (power input, ground, signaling, and conductive connections), metallic fill bodies, and vias (or other interlayer connections) may be positioned into one or more mask patterns for lithography and/or etching processes. In block 360, metallization may be deposited to create the conductive lines, metallic fill bodies, and vias. In general, the metallization deposited includes positioning at least a power input line adjacent to and on one side of a region including high-k value dielectric material and a ground line on the opposite side of the region of high-k value dielectric material. It is further implied that specific conductive element arrangements described above and further below are part of the process steps for the mask patterning and metallization. In addition, additional substrate layers may be deposited onto the substrate layer shown in block 310, or the substrate layer of block 310 may be deposited onto another substrate layer that includes one or more of the elements described herein.

Figure 4:
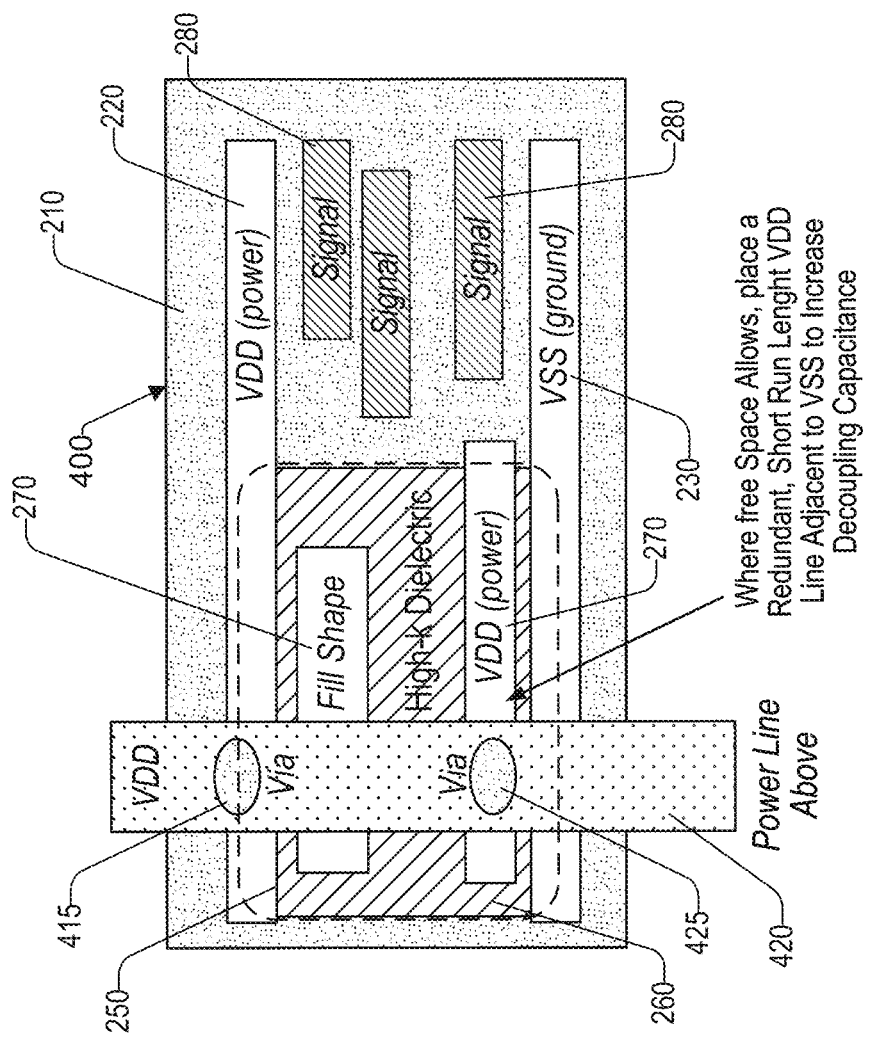
FIG. 4 is a diagrammatic view of the section of the semiconductor device of FIG. 2, incorporating a bridge power line, according to an embodiment.

FIG. 4 shows a semiconductor device 400 that is similar to the device 200 except that additional interconnect structures may be incorporated into substrate layers (not shown for sake of illustration) above and/or below the substrate layer of the region 250. In one embodiment, the semiconductor device 400 includes a power input line 420 that may be positioned above (or below) the region 250. The power input line 420 may be positioned orthogonally to the power input line 220 so that the power input line 420 spans across the region 250 from at least a plane defined by the power input line 220 to at least a plane defined by the ground line 230. The power input line 420 may include a first via 415 connecting the power input line 420 to the power input line 220. In some embodiments, the region 250 may include one or more metallic fill bodies 270. The power input line 420 may include a second via 425 that connects the power input line 420 to one of the metallic fill bodies 270. As shown, in some embodiments, the power input line 420 may be used to jump over one or more metallic fill bodies 270 to control the decoupling capacitance with the ground line 230. In the embodiment shown, the power input line 420 connects to a metallic fill body 270 that is closely spaced to the ground line 230. The jumped metallic fill body 270 becomes the de facto new power input line for purposes of forming a decoupling capacitor with the ground line 230.

It will be understood that while not shown in this manner, the conductive element used to connect to the power input line 220 may instead be used to connect to the ground line 230 in another embodiment. The via 425 may connect the jumper to one of the metallic fill bodies 270 which in effect, changes the ground side conductor element to the metallic fill body 270 in the decoupling capacitor.

Figure 5:
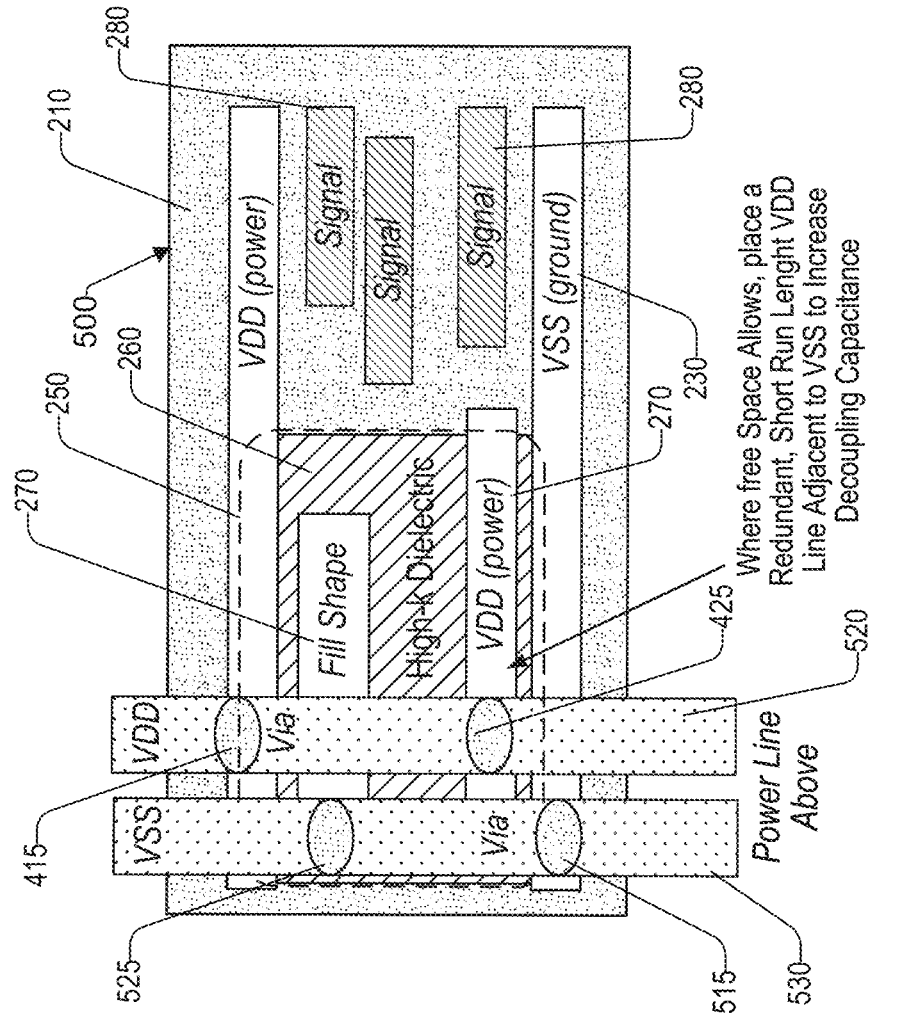
FIG. 5 is a diagrammatic view of the section of the semiconductor device of FIG. 4, incorporating a bridge ground line, according to an embodiment.

FIG. 5 shows a semiconductor device 500 that incorporates the two variations using jumper elements disclosed in FIG. 4. The semiconductor device 500 includes simultaneous integration of a jumper 520 connecting the power input line 220 to a metallic fill body 270 in the region 250. The semiconductor device 500 also includes a jumper 530 connecting the ground line 230 (through via 515) to another metallic fill body 270 (through via 525) in the region 250.

As may be appreciated, by using a jumper type conductive line, the decoupling capacitance for an area may be controlled based partly on connecting metallic fill bodies 270 of different distances to either the power input line 220 or the ground line 230 while simultaneously being able to avoid metallic fill bodies 270 (if necessary) that may intervene between any of the capacitor elements. The effective distance between capacitor conductor elements may be controlled so that the range of capacitance is based on the breadth of the region 250, the distance of a metallic fill body 270 to either the power input line 220 or groundline 230, or the distance between any two metallic fill bodies 270 connected to its respective power input line 220 and ground line 230. As shown, the decoupling capacitance field may be based on a narrow spacing between two metallic fill bodies 270. Also, the position of the decoupling capacitance field output may be shifted depending on which two features are used for the decoupling capacitor; for example, using a metallic fill body 270 and the power input line 220 shifts the field up; using the ground line 230 and a metallic field body shifts the field down, and using two metallic fill bodies may shift the field up or down depending on the positions of respective fill bodies).

Figure 6:
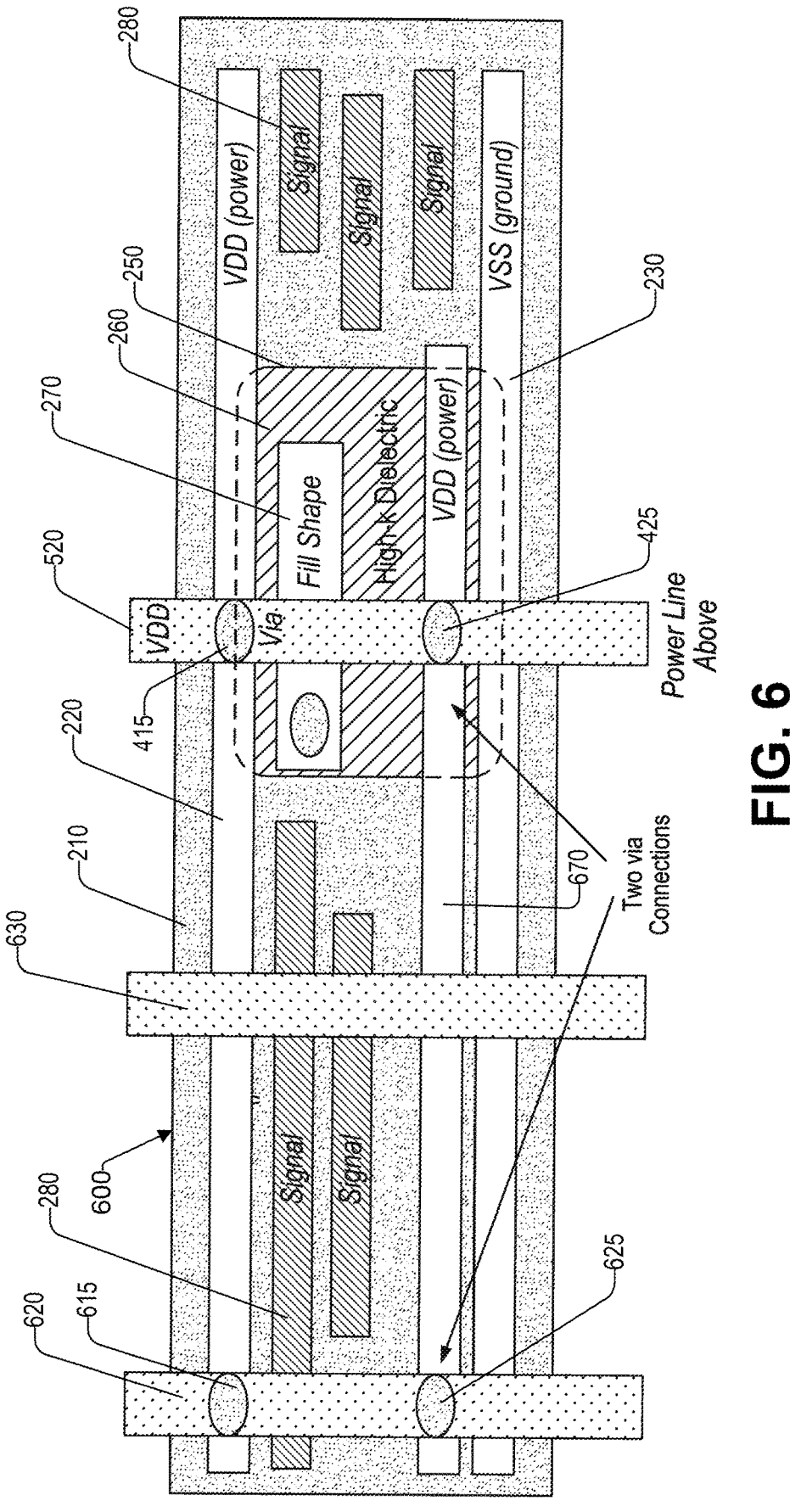
FIG. 6 is a diagrammatic view of the section of the semiconductor device of FIG. 2, incorporating an extended power line and additional jumper lines, according to an embodiment.

FIG. 6 shows another embodiment of a semiconductor device 600 is similar to the semiconductor device 500 except that the semiconductor device 600 also incorporates jumper lines 620 and 630 that are non-planar with the region 250. Jumper 630 is not shown connected to anything but is included to show how various connections may be made to one or more of the other elements while avoiding connection to a signal line 280. In the semiconductor device 600, one (or more) of the metallic fill bodies 670 is initially floating. The metallic fill body 670 is at least partially within the region 250 and extends to outside of the region 250. The jumper elements 620 and 630 may be positioned away from (nonplanar to) the region 250 to connect to either the power input line 220 or the ground line 230 respectively. The jumper 620 may connect to the power input line 220 through via 615. The jumper 620 may connect to the metallic fill body 670 through via 625. The embodiment shown provides both increased decoupling capacitance and a local resistance reduction in the power delivery network. The local resistance reduction is due to the addition of an extra parallel conduction pathway in the power delivery network. The extra signal line added between at least two other existing power lines acts as an additional resistive pathway, reducing the parallel resistance of the power grid.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor chip device, comprising:
a substrate including a first dielectric material of a first permittivity value;
a first power input line in the substrate;
a first ground line positioned adjacent the first power input line and arranged to form a first decoupling capacitor in cooperation with the first power input line; and
a region of the substrate laterally between the first power input line and the first ground line, doped with a second dielectric material of a second permittivity value, wherein the second permittivity value is higher than the first permittivity value, the region lacks a signal body, and the region including the second dielectric material has a sidewall in contact with a sidewall of the first dielectric material that is located laterally between the first power input line and the first ground line.

2. The semiconductor chip device of claim 1, further comprising a metallic fill body in the region of the substrate doped with the second dielectric material.

3. The semiconductor chip device of claim 2, further comprising a connection line from the first power input line to the metallic fill body.

4. The semiconductor chip device of claim 3, further comprising a second power input line connected to the first power input line, wherein:
the first power input line and the first ground line are positioned in a first layer of the substrate;
the second power input line is positioned in a second layer of the substrate;
the metallic fill body is connected to the second power input line;
the metallic fill body is connected to the first power input line through the connection line to the second power input line; and
the metallic fill body is positioned adjacent to the first ground line and arranged to form a second decoupling capacitor in cooperation with the first ground line.

5. The semiconductor chip device of claim 4, further comprising a conductive connection of the first power input line to the second power input line, wherein:
the second power input line is positioned orthogonal to the first power input line and non-planar to the region of the substrate doped with the second dielectric material; and
the metallic fill body extends out from the region of the substrate doped with the second dielectric material and intersects a plane orthogonal to the second power input line.

6. The semiconductor chip device of claim 3, further comprising a second ground line connected to the first ground line, wherein:
the first power input line and the first ground line are positioned in a first layer of the substrate;
the second ground line is positioned in a second layer of the substrate;
the metallic fill body is connected to the second ground line;
the metallic fill body is connected to the first ground line through the connection line to the second ground line; and
the metallic fill body is positioned adjacent to the first power input line and arranged to form a second decoupling capacitor in cooperation with the first power input line.

7. The semiconductor chip device of claim 1, further comprising:
a first metallic fill body and a second metallic fill body in the region of the substrate doped with the second dielectric material;
a second power input line connected to the first power input line; and
a second ground line connected to the first ground line, wherein:
the first power input line and the first ground line are positioned in a first layer of the substrate,
the second power input line and the second ground line are positioned in a second layer of the substrate,
the first metallic fill body is connected to the second power input line,
the first metallic fill body is connected to the first power input line through a connection line to the second power input line,
the second metallic fill body is connected to the second ground line,
the second metallic fill body is connected to the first ground line through the connection line to the second ground line, the first metallic fill body is positioned adjacent to the first power input line and arranged to form a second decoupling capacitor in cooperation with the first power input line, and the second metallic fill body is positioned adjacent to the first ground line and arranged to form a third decoupling capacitor in cooperation with the first ground line.

8. The semiconductor chip device of claim 1, wherein the region of the substrate doped with the second dielectric material lacks a signal line.

* * * * *